(12) United States Patent
Otte

(10) Patent No.: US 10,057,048 B2
(45) Date of Patent: Aug. 21, 2018

(54) DATA HANDOFF BETWEEN RANDOMIZED CLOCK DOMAIN TO FIXED CLOCK DOMAIN

(71) Applicant: ANALOG DEVICES, INC., Norwood, MA (US)

(72) Inventor: Eric Otte, Boston, MA (US)

(73) Assignee: ANALOG DEVICES, INC., Norwood, MA (US)

( * ) Notice: Subject to any disclaimer, the term of this patent is extended or adjusted under 35 U.S.C. 154(b) by 44 days.

(21) Appl. No.: 15/214,176

(22) Filed: Jul. 19, 2016

(65) Prior Publication Data

US 2018/0026781 A1 Jan. 25, 2018

(51) Int. Cl.
*H04L 7/00* (2006.01)
*H04L 7/02* (2006.01)

(52) U.S. Cl.
CPC ..................... *H04L 7/02* (2013.01)

(58) Field of Classification Search
CPC ..... H04L 7/0337; H04L 7/0334; H04L 7/033; H04L 7/0029; H03L 7/091
USPC ................................. 375/354–376
See application file for complete search history.

(56) References Cited

U.S. PATENT DOCUMENTS

| | | | | |
|---|---|---|---|---|
| 4,004,100 A * | 1/1977 | Takimoto | ............... | H04J 3/0611 370/509 |
| 4,048,563 A * | 9/1977 | Osborne | .................. | G01S 11/10 375/367 |
| 4,211,891 A * | 7/1980 | Glitz | .......................... | H04L 9/12 375/354 |
| 4,677,614 A * | 6/1987 | Circo | ..................... | H04J 3/0641 370/222 |
| 6,512,787 B1 * | 1/2003 | Tung | .................... | H04L 25/4927 370/515 |
| 6,542,017 B2 * | 4/2003 | Manganaro | .......... | G11C 27/026 327/291 |
| 6,891,881 B2 * | 5/2005 | Trachewsky | .......... | H04L 1/0003 375/143 |

(Continued)

OTHER PUBLICATIONS

Christian Vogel et al., *A Novel Channel Randomization Method for Time-Interleaved ADC's*, IMTC 2005—Instrumentation and Measurement Technology Conference, Ottawa, Canada, May 17-19, 2005, 6 pages.

(Continued)

*Primary Examiner* — James M Perez
(74) *Attorney, Agent, or Firm* — Patent Capital Group

(57) ABSTRACT

A time-interleaved analog-to-digital converter (ADC) having M ADCs can increase the sampling speed several times compared to the sampling speed of just one ADC. Some time-interleaved ADCs randomize the order of the M ADCs sampling the analog input signal to improve dynamic performance. Randomization causes the output data of the M ADCs to be valid at randomized time instants. When the output data is sampled using a rising edge of a fixed clock, the output data can be valid just before, valid right at, or only valid for a short period of time after, the rising edge. Therefore, the setup or hold time can be very short. To address this issue, information regarding the randomized selection of an ADC is used to control the sampling occurring in the fixed clock domain and avoid the short setup or hold time.

20 Claims, 11 Drawing Sheets

(56) References Cited

U.S. PATENT DOCUMENTS

| | | | | |
|---|---|---|---|---|
| 6,983,009 B2* | 1/2006 | Lomp | H04B 1/707 | 375/149 |
| 6,993,101 B2* | 1/2006 | Trachewsky | H04L 1/0003 | 375/343 |
| 7,412,018 B1* | 8/2008 | Natali | H04J 13/0022 | 375/143 |
| 8,155,165 B2* | 4/2012 | Agoston | H04B 15/02 | 375/130 |
| 8,564,464 B2* | 10/2013 | Carreau | G11C 27/02 | 341/122 |
| 8,890,729 B2* | 11/2014 | Lewis | H03M 1/0673 | 341/118 |
| 8,948,332 B2* | 2/2015 | Kenney | G01R 25/005 | 375/373 |
| 9,294,112 B1* | 3/2016 | Devarajan | H03M 1/121 | |
| 9,485,039 B1* | 11/2016 | Malkin | H04B 17/14 | |
| 9,503,116 B2* | 11/2016 | Speir | H03M 1/1019 | |
| 9,525,428 B2* | 12/2016 | Devarajan | H03M 1/1019 | |
| 9,608,655 B1* | 3/2017 | Li | H03M 1/069 | |
| 9,654,133 B2* | 5/2017 | Speir | H03M 1/1019 | |
| 9,729,160 B1* | 8/2017 | Marvasti | H03M 1/001 | |
| 9,793,910 B1* | 10/2017 | Devarajan | H03M 1/1215 | |
| 2005/0069025 A1* | 3/2005 | Kimura | H04B 1/7075 | 375/152 |
| 2007/0109168 A1* | 5/2007 | Hennessy | H03M 1/0639 | 341/155 |
| 2013/0076402 A1* | 3/2013 | Carreau | G11C 27/02 | 327/91 |
| 2013/0335141 A1* | 12/2013 | Ahmad | H03F 3/387 | 330/69 |
| 2014/0126678 A1* | 5/2014 | Cirit | H04L 7/033 | 375/375 |
| 2016/0049949 A1* | 2/2016 | Waltari | H03M 1/0626 | 341/120 |
| 2016/0182073 A1* | 6/2016 | Speir | H03M 1/1019 | 341/120 |
| 2016/0182075 A1* | 6/2016 | Devarajan | H03M 1/1019 | 341/120 |
| 2016/0373120 A1* | 12/2016 | Caffee | H03L 7/091 | |
| 2017/0111054 A1* | 4/2017 | Van Engelen | H03M 1/38 | |
| 2017/0111082 A1* | 4/2017 | Zhu | H04B 1/66 | |
| 2017/0118012 A1* | 4/2017 | Pernull | H04L 9/0662 | |
| 2018/0041198 A1* | 2/2018 | Kelly | H03K 3/013 | |
| 2018/0102895 A1* | 4/2018 | Schell | H04L 7/0012 | |

OTHER PUBLICATIONS

Application Note 1604, ISLA11XP50 Output Data Timing and Synchronization, intersil®, Oct. 4, 2010, AN1604.0, 6 pages.

* cited by examiner

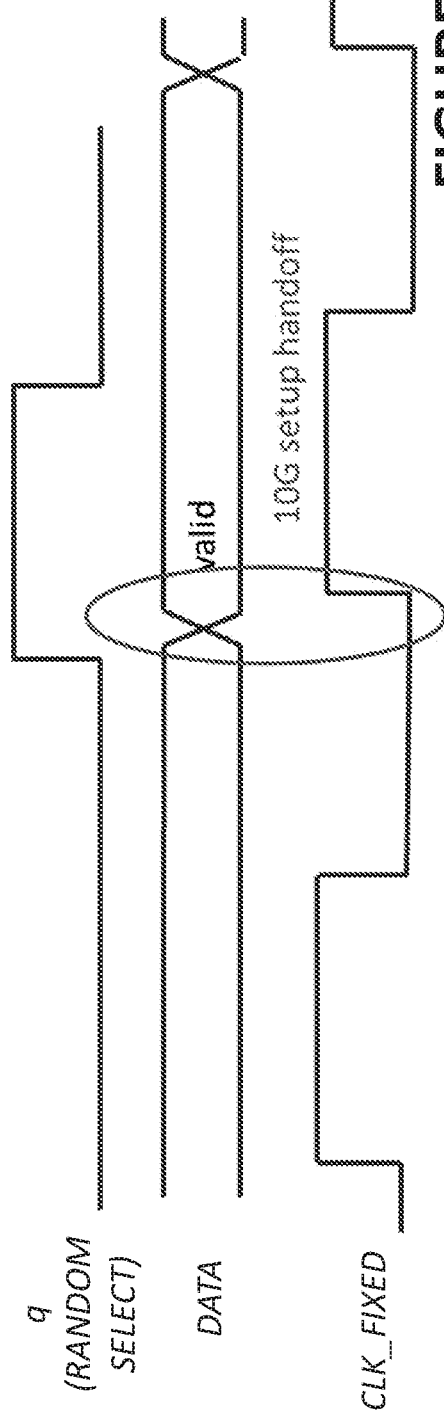
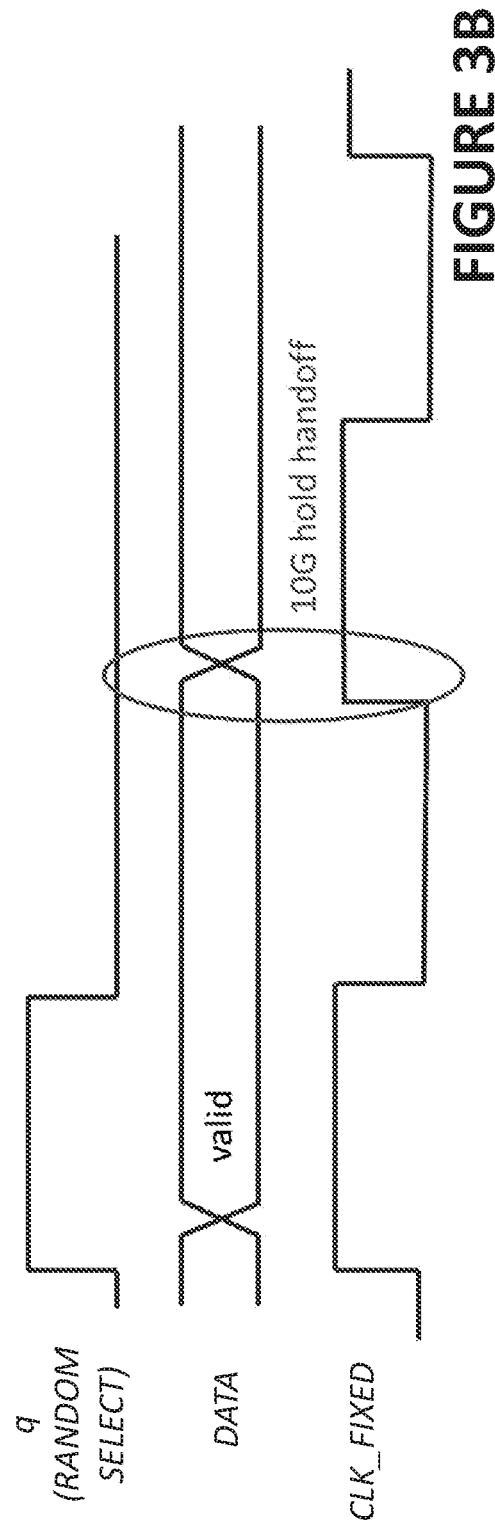

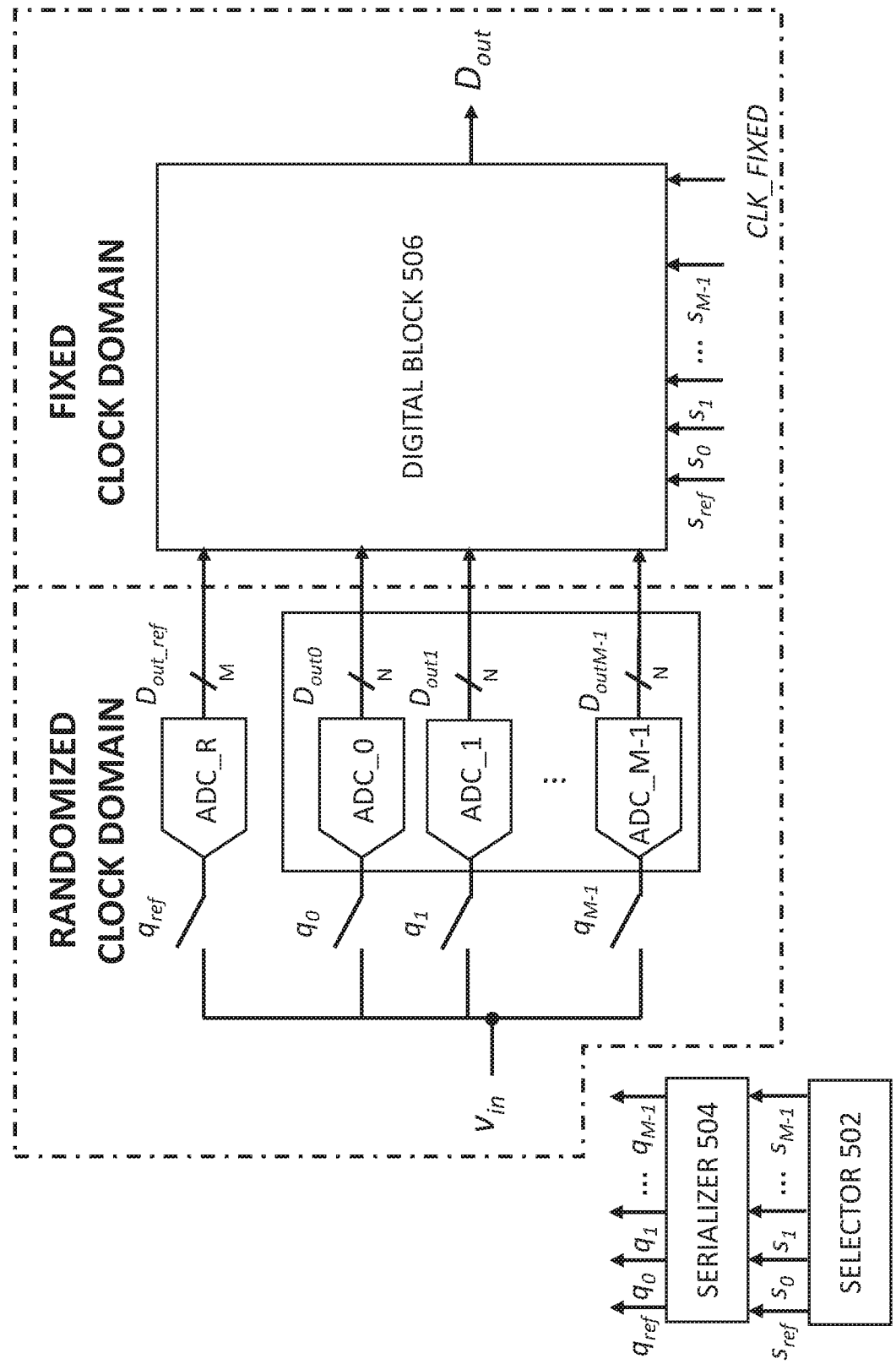

US 10,057,048 B2

DATA HANDOFF BETWEEN RANDOMIZED CLOCK DOMAIN TO FIXED CLOCK DOMAIN

TECHNICAL FIELD OF THE DISCLOSURE

The present invention relates to the field of integrated circuits, in particular to data handoff between a randomized clock domain and a fixed clock domain.

BACKGROUND

In many electronics applications, an analog-to-digital converter (ADC) converts an analog input signal to a digital output signal, e.g., for further digital signal processing or storage by digital electronics. Broadly speaking, ADCs can translate analog electrical signals representing real-world phenomenon, e.g., light, sound, temperature, electromagnetic waves, or pressure for data processing purposes. For instance, in measurement systems, a sensor makes measurements and generates an analog signal. The analog signal would then be provided to an analog-to-digital converter (ADC) as input to generate a digital output signal for further processing. In another instance, a transmitter generates an analog signal using electromagnetic waves to carry information in the air or a transmitter transmits an analog signal to carry information over a cable. The analog signal is then provided as input to an ADC at a receiver to generate a digital output signal, e.g., for further processing by digital electronics.

Due to their wide applicability in many applications, ADCs can be found in places such as broadband communication systems, audio systems, receiver systems, etc. Designing an ADC is a non-trivial task because each application may have different needs in performance, power, cost and size. ADCs are used in a broad range of applications including Communications, Energy, Healthcare, Instrumentation and Measurement, Motor and Power Control, Industrial Automation and Aerospace/Defense. As the applications needing ADCs grow, the need for fast yet accurate conversion also grows. Designing an ADC, including designing a proper clocking scheme, can be a complex and challenging task.

BRIEF DESCRIPTION OF THE DRAWING

To provide a more complete understanding of the present disclosure and features and advantages thereof, reference is made to the following description, taken in conjunction with the accompanying figures, wherein like reference numerals represent like parts, in which:

FIGS. 3A-B illustrate a short setup time and a short hold time when transitioning from the randomized clock domain to the fixed clock domain;

FIG. 5 shows an exemplary randomized time-interleaved ADC where the sampling is controlled by selection codes, according to some embodiments of the disclosure;

DESCRIPTION OF EXAMPLE EMBODIMENTS OF THE DISCLOSURE

Overview

A time-interleaved analog-to-digital converter (ADC) having M ADCs (sometimes referred herein as "sub-ADCs") can increase the sampling speed several times compared to the sampling speed of just one ADC. Some time-interleaved ADCs (so called randomized time-interleaved ADCs) randomize the order of the M ADCs sampling the analog input signal to improve dynamic performance. Randomization causes the output data of the M ADCs to be valid at randomized time instants. When the output data is sampled using a rising edge of a fixed clock, the output data can be valid just before, valid right at, or only valid for a short period of time after, the rising edge. Therefore, the setup or hold time can be very short. To address this issue, information regarding the randomized selection of an ADC is used to control the sampling occurring in the fixed clock domain and avoid the short setup or hold time.

Basics of Analog-to-Digital Converters

Analog-to-digital converters (ADCs) are electronic devices that convert a continuous physical quantity carried by an analog signal to a digital output or number that represents the quantity's amplitude (or to a digital signal carrying that digital number). An ADC can be defined by the following application requirements: its bandwidth (the range of frequencies of analog signals it can properly convert to a digital signal) and its resolution (the number of discrete levels the maximum analog signal can be divided into and represented in the digital signal). An ADC also has various specifications for quantifying ADC dynamic performance, including signal-to-noise-and-distortion ratio SINAD, effective number of bits ENOB, signal to noise ratio SNR, total harmonic distortion THD, total harmonic distortion plus noise THD+N, and spurious free dynamic range SFDR. ADCs have many different designs, which can be chosen based on the application requirements and specifications.

Understanding Time-Interleaved ADCs

Figure 1:
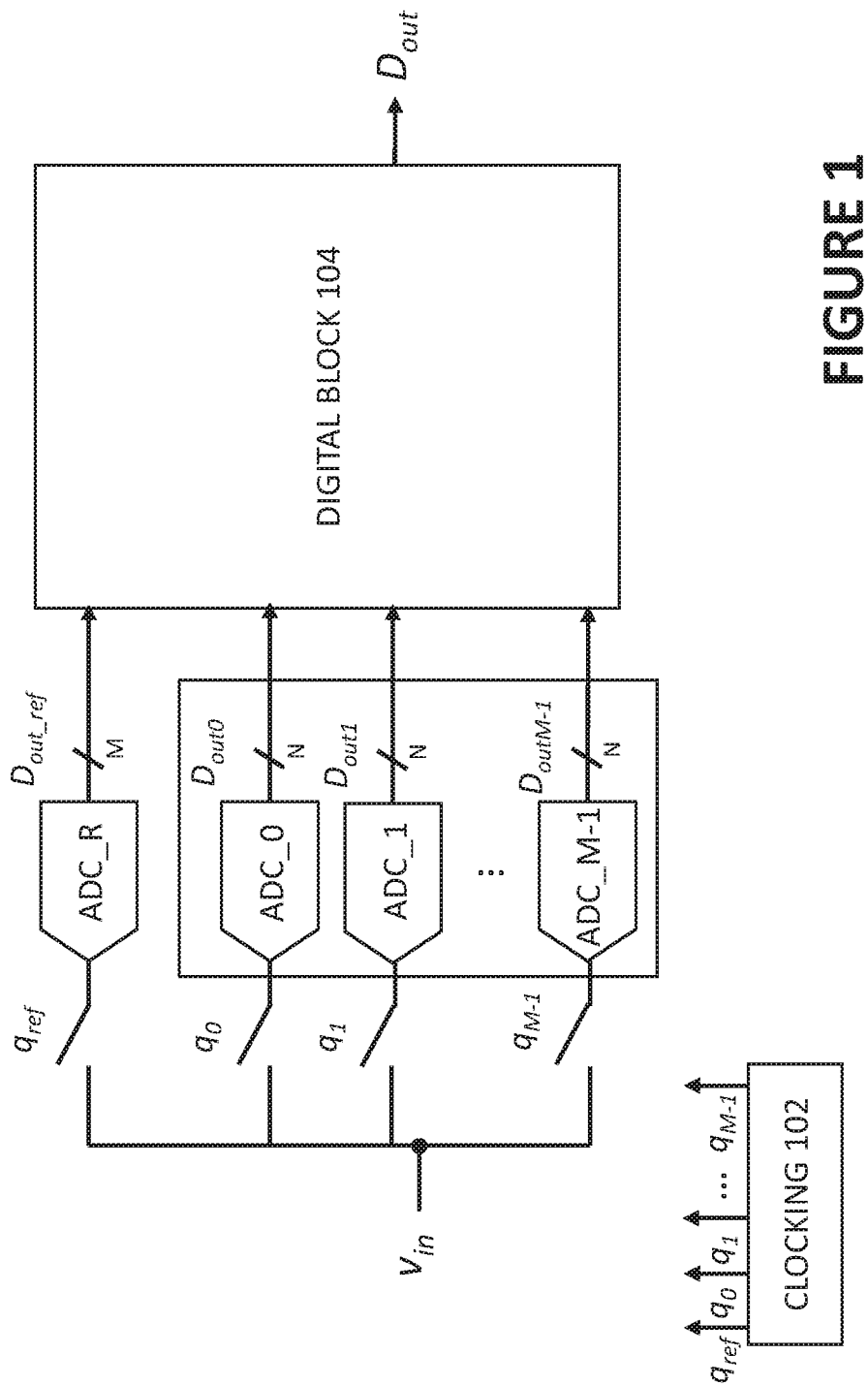
FIG. 1 shows an exemplary time-interleaved ADC having M ADCs.

Interleaving is a technique used to increase the sample rate of ADCs. Many (low-speed) ADCs can be used in parallel, operating to sample an analog input one after another (in a time-interleaved fashion). Using appropriate clocking to control the ADCs can greatly increase the effective combined ADC sampling rate. FIG. 1 shows an exemplary time-interleaved ADC having M ADCs, shown as ADC_0 to ADC_M−1 (sometimes referred herein as sub-ADCs). Together, with appropriate clocking, the M sub-ADCs can provide a very high sampling rate. The appropriate clocking can be provided by clocking block 102 to produce clock signals or selection signals, $q_0$, $q_1$, $q_{M-1}$, having different phases, to select one of the M ADCs for sampling the analog input signal for a given cycle and converting the analog input signal to a digital output. Phrased differently, the clocking block 102 can produce selection signals triggering the M ADCs in the time-interleaved analog-to-digital converter to sample the analog input signal $v_{in}$ in a sequential manner and time-interleaved manner. M can be greater than or equal to two. The M ADCs sample the input signal $v_{in}$ one after another and produce corresponding digital outputs, $D_{out0}$, $D_{out1}$, $D_{outM-1}$, respectively, which are then combined by the digital block 104 to produce the digital output $D_{out}$. In one example, the M ADCs can operate in a round-robin fashion or sequential fashion, where the M ADCs samples the input in a fixed sequence or sequential manner.

While time-interleaving is often used to increase the sampling rate of ADCs, time-interleaving can introduce new errors (i.e. offset/gain/timing) when the interleaved sub-ADCs have mismatches. Specifically, the type of sequential interleaving described above suffers from the property that any mismatches between the M ADCs and even errors after error calibration would show up in the ADC output frequency spectrum (e.g., a spectrum generated by a Fast Fourier Transform) as spurs in discrete frequency bins with large concentrated energy content. These spurs can be undesirable for many applications, and can significantly affect the dynamic performance of the time-interleaved ADC. To address this issue, time-interleaved ADCs can operate in a pseudo-randomized fashion, so that the mismatch errors would be "averaged out". As a result, the spurs mentioned previously can be "spread over the noise floor". Randomized time-interleaved ADCs randomize (e.g., "shuffled") the sampling pattern of the interleaved ADCs to spread fixed patterns of errors (tones or spurs) into colored noise, thereby improving SFDR. A digital "track-select" function is used to select the sub-ADC to sample the analog input next, based on previous selections and a set of constraints (e.g. for 8-way interleaved, a converter can sample at max every 5th sample due to the inherent duration that a particular sub-ADC remains "busy" once it has been selected).

To implement pseudo-randomized time-interleaved sampling, one of the idle or ready-to-sample ADCs (generally one or more other ADCs would be busy sampling and/or performing a conversion of the analog input) can be randomly selected by the clocking block 102 as the ADC being used for sampling the analog input signal for a given cycle and converting the analog input signal to a digital output. Phrased differently, the clocking block 102 can generate selection signals $q_0$, $q_1$, ... $q_{M-1}$, running at the full ADC clock rate for triggering sampling by the analog-to-digital converters in a time-interleaved and pseudo-randomized manner. When a given ADC is selected, it cannot be selected immediately after for a certain (fixed) number of cycles, since generally it would take more than one cycle to perform at least a part of the conversion before the given ADC is free to sample the analog input signal again. Of the remaining ADC choices (ready-to-sample again, or idle), one is chosen randomly. Such selection implements pseudo-randomization. ADC selection sequence or the sequence in which the ADCs sample the analog input and produce digital outputs can be randomized, or at least pseudo-randomized. Randomized time-interleaved ADCs can have three or more ADCs (i.e., M is greater than or equal to three). Based on the sequence, the clocking block 102 generates appropriate clocking/selection signals, $q_0$, $q_1$, ... $q_{M-1}$, to cause the M ADCs to sample the analog signal $v_{in}$ in a pseudo-randomized sequence and produce digital outputs $D_{out1}$, $D_{out2}$, $D_{out3}$ according to the pseudo-randomized sequence. The selection signals or sequence information can be provided to the digital block 104 to ensure the digital block 104 can combine the digital outputs $D_{out1}$, $D_{out2}$, $D_{out3}$ in accordance with the pseudo-randomized sequence.

In some embodiments, the time-interleaved ADCs has a reference ADC, ADC_R, added to the ADC help with calibration of interleaving errors. The reference ADC can be selected with selection signal $q_{ref}$ to (directly) sample the analog input $v_{in}$ and the reference ADC generates a digital output $D_{out\_ref}$. Generally, the reference ADC is of a lower resolution (very noisy). Sometimes, when the sub-ADC takes a sample, the reference ADC also samples along with and in parallel with the main ADC at substantially the same time (or at a fixed time delta with respect to the time when the main ADC takes a sample). In embodiments where the main ADC has a plurality of time-interleaved sub-ADCs which are operating in a pseudo-randomized sequence (i.e., the time-interleaved sub-ADCs are randomly sampling the analog input), the reference ADC can be randomly sampling the analog input. A randomly sampling reference ADC means that the (instantaneous or any given) sampling period can vary or can be randomized so that the sampling frequency is spread out across multiple frequencies or a range of frequencies. Advantageously, having the randomly sampling reference ADC can avoid calibration issues caused by periodicity in the system. In some cases, the reference ADC has a maximum sampling rate that is slower than the effective sampling rate of the main ADC (e.g., effective rate of the time-interleaved sub-ADCs). The sampling rate of the reference ADC may be closer to the sampling rate of one of the time-interleaved ADCs. When one of sub-ADCs in the main ADC is sampling, the reference ADC may not necessarily be sampling along with the one ADC that is sampling since the sampling rate of the reference ADC is slower than the effective rate of the time-interleaved sub-ADCs. However, over time, the reference ADC is expected to sample substantially the same number of times with each of the sub-ADCs in the main ADC. The reference ADC, when it is selected to sample the analog input, can sample the analog input substantially alongside with another selected sub-ADC.

Randomized Clock Domain Interfaces with Fixed Clock Domain

Figure 2:
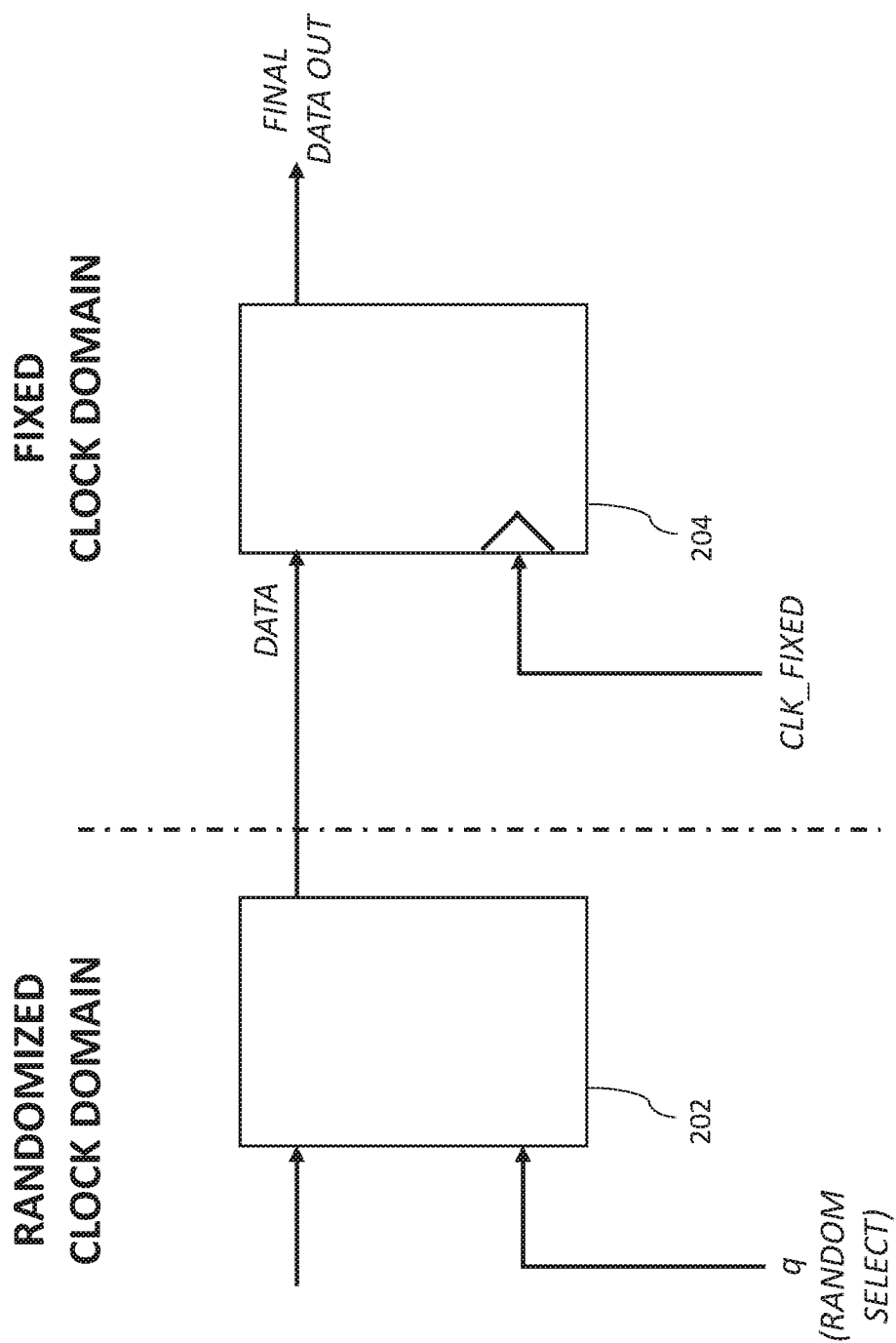
FIG. 2 shows an exemplary system having a randomized clock domain and a fixed clock domain.

One issue with random sampling of high-speed interleaved ADCs is the clocking scheme. In the analog domain, typically the random track-select signal, often referred herein as the selection signals (e.g., $q_{ref}$, $q_0$, $q_1$, ... $q_{M-1}$) or the random clock is pipelined at the full ADC clock rate and used as a random clock for selecting one of the sub-ADCs or reference ADC to sample the analog input. One of the sub-ADCs would sample every cycle of the full ADC clock rate by means of the selection signals and generate digital outputs accordingly. If the full ADC clock rate is 10 GHz, then one of the sub-ADCs would sample the analog input every period of the full ADC clock rate. If a reference ADC is used, the reference ADC can sample the analog input along with one of the sub-ADCs. Unfortunately it is difficult to reproduce the random clock in the digital domain for very high-speed clock rates because the random clock must be routed and piped across the entire digital layout. One approach to avoid having to reproduce the random clock in the digital domain is to handoff data from the analog "randomized clock domain" to a digital "fixed clock domain". FIG. 2 shows an exemplary system having a randomized clock domain and a fixed clock domain. On the randomized clock domain side, circuitry 202 can operate with the random clock, represented by random selection signal "q (RANDOM SELECT)", e.g., running at the full ADC clock rate. Circuitry 202 can include an ADC, such as a sub-ADC, or a reference ADC. On the fixed clock domain side, circuitry 204 can operate with a fixed clock, represented by "CLK_FIXED", e.g., running at the rate of one of the sub-ADCs. In one example, the random clock is pipelined at a full ADC clock rate of 10 GHz, whereas the fixed clock can have a rate of 1.25 GHz (e.g. rate of one of the sub-ADCs or reference ADC). Circuitry 204 can include digital circuitry for capturing/storing/latching the output data, represented as "DATA", from the randomized clock domain. For instance, the digital circuitry can have a flip flop that latches the output data on the rising edge of the fixed clock CLK_FIXED.

When moving from the randomized clock domain to the fixed clock domain, the handoff can be difficult because the random clock can fall right before, on top of, or after the fixed clock. Phrased differently, the random selection signal q (RANDOM SELECT), i.e., the random clock, running at the full ADC clock rate can mean that the data generated by circuitry 202 is valid at the output of circuitry 202 at a randomized time instant. Referring back to the example of q (RANDOM SELECT) running at 10 GHz, and the fixed clock CLK_FIXED running at 1.25 GHz, it is possible that circuitry 204 has a little as 100 ps for its setup time or hold time to sample the data. Phrased differently, handing off from the randomized clock domain to the fixed clock domain means that the handoff has a setup time of the full ADC sampling rate and no extra hold margin. FIGS. 3A-B illustrate a short setup time and a short hold time when transitioning from the randomized clock domain to the fixed clock domain. In FIG. 3A, the random selection signal q (RANDOM SELECT) causes the data to be ready just before the rising edge of the fixed clock CLK_FIXED. In FIG. 3B, the random selection signal q (RANDOM SELECT) causes the data to be ready or stable for only a very short period of time after the rising edge of the fixed clock CLK_FIXED. In both scenarios, it can be a challenge to design/implement circuitry 204 of FIG. 2 in the fixed clock domain to accommodate the short setup or hold time to latch the data (properly). Violation of setup or hold time can cause incorrect data to be latched.

While many examples herein relate to latching data from sub-ADCs or the reference ADC in a randomized time-interleaved ADCs, it is appreciated that the present disclosure can apply to other systems having to interface between a randomized clock domain and a fixed clock domain.

Solution to Avoid Short Setup or Hold time

Figure 4A:
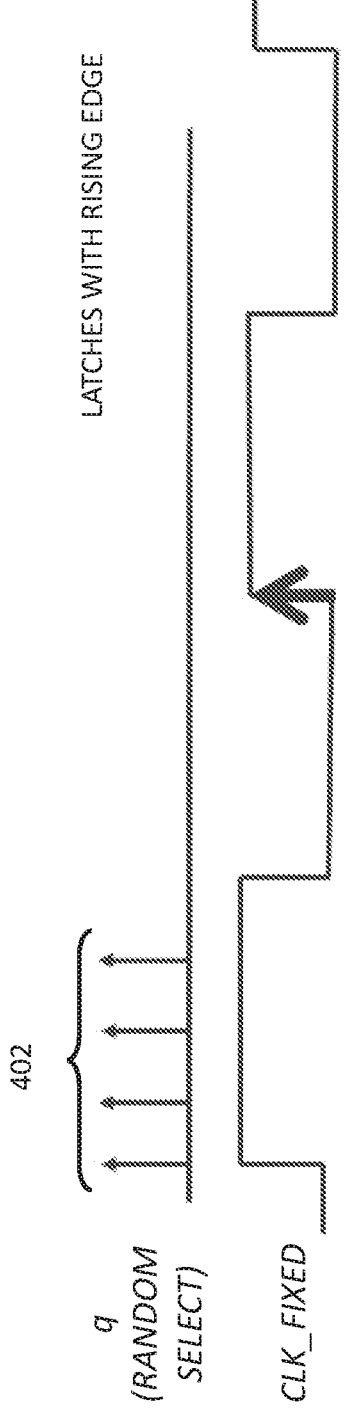
FIGS. 4A-B illustrate a solution for avoiding a short setup time and a short hold time when transitioning from the randomized clock domain to the fixed clock domain, according to some embodiments of the disclosure.
Figure 4B:
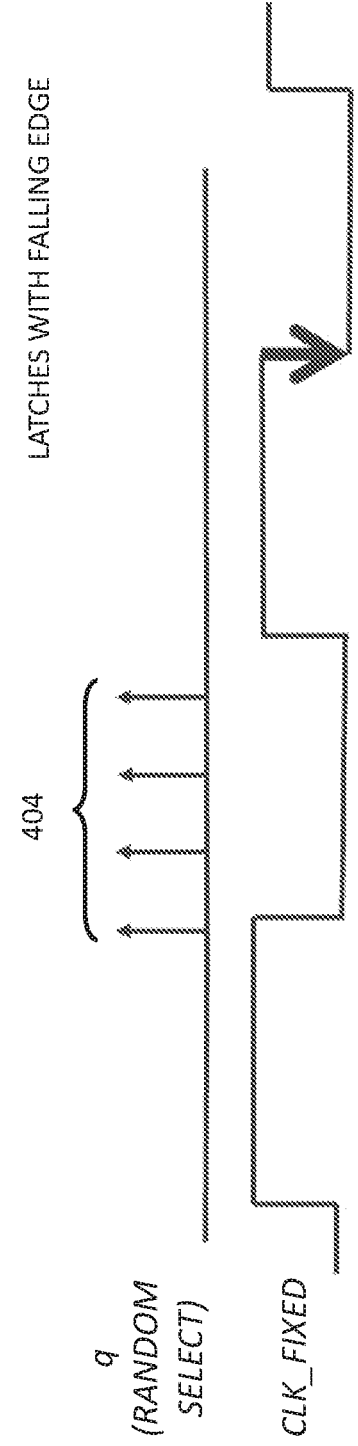

FIGS. 4A-B illustrate a solution for avoiding a short setup time and a short hold time when transitioning from the randomized clock domain to the fixed clock domain, according to some embodiments of the disclosure. To address the issue of short setup/hold time when going from a randomized clock domain to a fixed clock domain, information regarding the timing of the random clock with respect to the fixed clock can be used as a "look-ahead" to assist the fixed clock domain. Specifically, the information can be used to control when the latching in the fixed clock domain should occur. For instance, the information can cause the fixed clock domain to latch the data at a later time instant in order to provide for more setup or hold time.

Consider an example where the random selection signal q or q (RANDOM SELECT) can select a sub-ADC and possibly reference ADC at the full ADC clock rate, and cause output data to be valid at one of eight time slots in a full period of the fixed clock. As illustrated by FIG. 4A, if the selection signals q (RANDOM SELECT) causes the data to be valid at any one of time instants 402 (e.g., the first half of the eight possible time slots during a period of the fixed clock), the fixed clock domain can latch the data when the fixed clock has a rising edge. As illustrated by FIG. 4B, if the selection signals q (RANDOM SELECT) causes the data to be valid at any one of time instants 404 (e.g., the second half of the eight possible time slots during a period of the fixed clock), the fixed clock domain can latch the data when the fixed clock has a falling edge. This improved scheme for latching the data can significantly extend the setup or hold time available to the circuitry 204 in the fixed clock domain of FIG. 2 to latch the data properly.

Using a Selection Code as Information to Control the Fixed Clock Domain

In practice, the random selection signal "q" is generated or determined by a selection code that specifies which one of the time slots the selection signal q becomes active and selects a particular sub-ADC or reference ADC to sample the analog input signal at a given time. The selection code, i.e., this "pre-knowledge" about the random selection signal, can be used to control the fixed clock domain, since the selection code provides information about when the data becomes valid in relation to the fixed clock. FIG. 5 shows an exemplary randomized time-interleaved ADC where the sampling is controlled by selection codes, according to some embodiments of the disclosure. As discussed previously, one of the sub-ADCs and possibly the reference ADC is randomly selected (in view of constraints) to sample the analog input signal at a given time slot. A selector 502 can generate respective selection codes, $s_{ref}$, $s_0$, $s_1$, . . . $s_{M-1}$, to control the timing of respective ADCs, encoding which time slot the respective ADC should sample the analog input. For instance, a number of bits can be used to encode which time slot a particular ADC should sample the analog input. Phrased differently, the selection code "s" can be an x-bit code which identifies a particular time slot randomly selected among a plurality of time slots within a period in the fixed clock domain, the particular time slot being the time when the ADC is sampling the input or the output data becomes valid. If there are 8 time slots, three bits can be used as the selection code. A serializer 504 can serialize the selection code to generate the random selection signals, $q_{ref}$, $q_0$, $q_1$, . . . $q_{M-1}$, in order to select a sub-ADC and possibly a reference ADC to sample the analog input at a given time slot. Effectively, the selection code can select one of the ADCs or a reference ADC among a plurality of ADCs in the randomized time-interleaved ADC to sample the analog input and generate output data. Furthermore, the selection code determines or dictates the timing instant when the output data from a selected ADC becomes valid (assuming there is a deterministic latency through an ADC). The selection codes can be provided to digital block 506 to control the handoff between the randomized clock domain (i.e., the random analog clock) and the fixed clock domain (i.e., the digital clock). Equipped with the selection codes, the digital block 506 would be informed of when the output data, i.e., random sample, becomes valid in relation to the fixed clock CLK_FIXED and adjust accordingly. Various implementations to leverage the selection codes are described in relation to FIGS. 7-11.

Method for Avoiding High Speed Data Handoff

Figure 6:
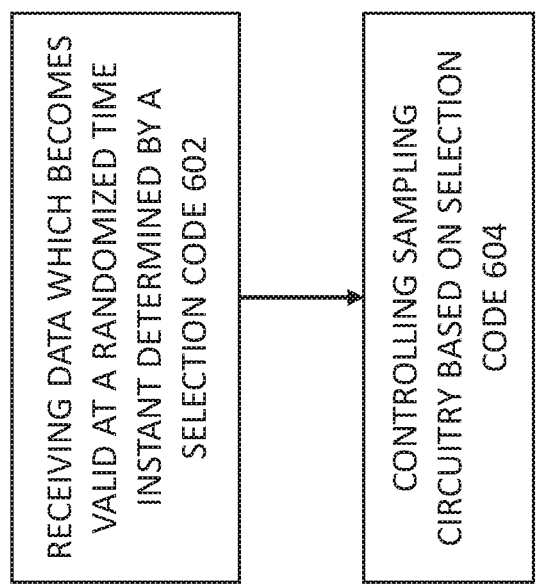
FIG. 6 is a flow diagram illustrating a method for avoiding high speed data handoff, according to some embodiments of the disclosure.

FIG. 6 is a flow diagram illustrating a method for avoiding high speed data handoff, according to some embodiments of the disclosure. In task 602, sampling circuitry, e.g., in the fixed clock domain (e.g., circuitry 204 of FIG. 2), receives data which becomes valid at a randomized time instant determined by a selection code. For instance, the data can become valid at one of X time slots, and the choice of the time slot is dictated by a selection code. The selection code can encode information regarding which time slot was chosen, and effectively selects an ADC among a plurality of ADCs at random to sample an analog input and generate the data. In task 604, the sampling circuitry is controlled or adjusted based on the selection code. The selection code serves as the "pre-knowledge" to assist the fixed clock domain in sampling the data generated based on a random analog clock. Controlling the sampling circuitry based on the selection code utilizes the "pre-knowledge" of timing of the random sample relative to the fixed clock to ensure that set up or hold time requirement for sampling the data is more easily met or can be met more easily. Phrased differently, the controlling of the sampling circuitry can make sure the sampling circuitry has a sufficiently long setup and/or hold time available to sample the data from the randomized clock domain by adjusting the sampling circuitry based on the selection code. The controlling of the sampling circuitry ensures setup or hold time is longer than a clock period of a random clock used to trigger generation of the data. If the randomized time-interleaved ADC is running with a random clock at 10 GHz, the fixed clock of the sampling circuitry is running at 1.25 GHz, the handoff without any adjustment/control can be as fast as a period of the full ADC clock rate, i.e., 100 ps. The controlling of the sampling circuitry can avoid a 10 GHz data handoff by making sure that the sampling circuitry in the fixed clock domain is adjusted to ensure a sampling instant of the sampling circuit has more setup and/or hold time than 100 ps.

System Implementing a Scheme for Avoiding High Speed Data Handoff

Figure 7:
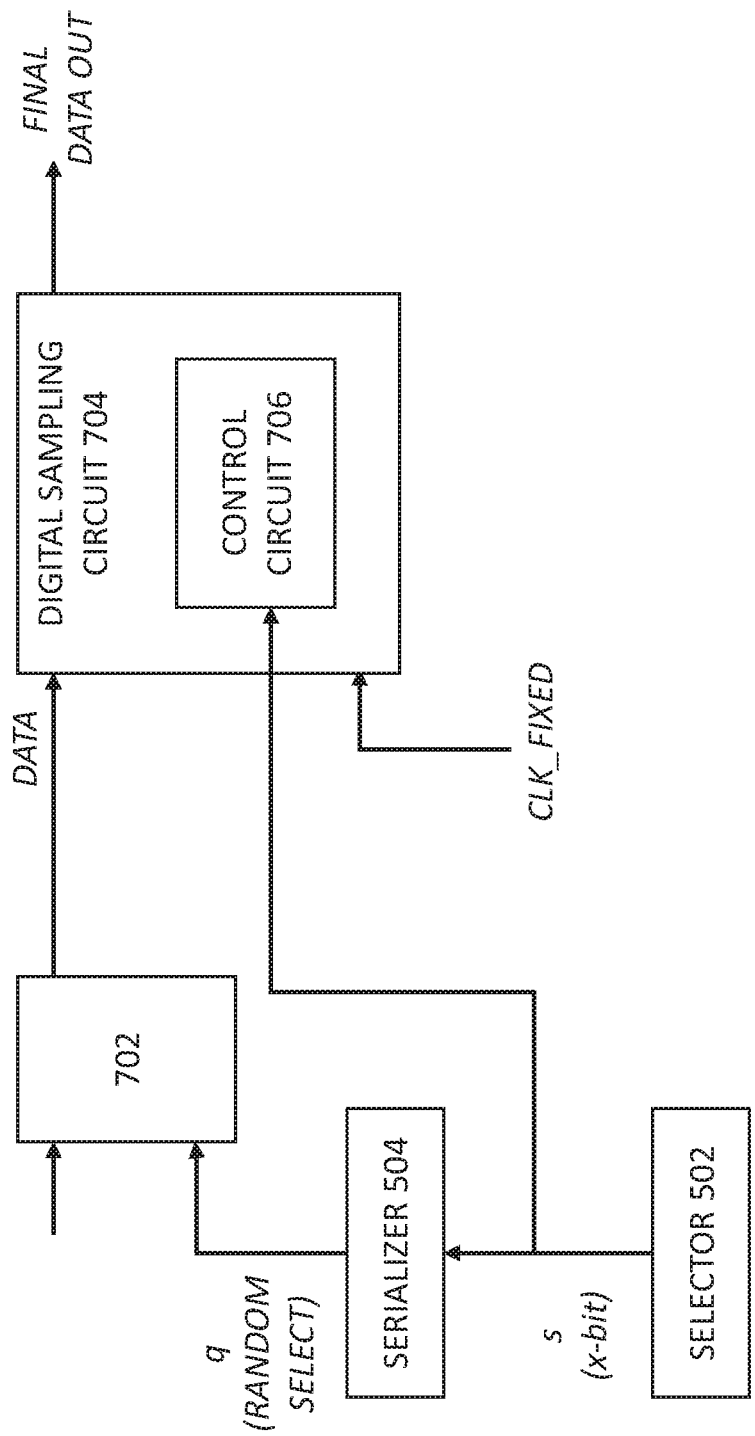
FIG. 7 illustrates an exemplary system implementing a scheme for avoiding the high speed data handoff, according to some embodiments of the disclosure.

FIG. 7 illustrates an exemplary system implementing a scheme for avoiding the high speed data handoff, according to some embodiments of the disclosure. The system includes circuitry 702 operating in a randomized fixed clock domain and (digital) sampling circuit 704 operating in a fixed clock domain. The digital sampling circuit 704 has a data input receiving a data signal from a randomized clock domain, e.g., generated by circuitry 702. For instance, the digital sampling circuit 704 can receive data "DATA" generated by a sub-ADC or reference ADC of a randomized time-interleaved ADC. The data is valid at a randomized time instant or time slot randomly selected from time slots spanning a period of a fixed clock "CLK_FIXED". The digital sampling circuit 704 further includes a control input receiving a selection code "s" which dictates a randomized time instant when the data signal becomes valid. As shown, the selection code s is generated by selector 502 as an x-bit code and is subsequently serialized by serializer 504 to generate a selection signal for triggering circuitry 702 to sample an analog input signal. The digital sampling circuit 704 further includes a control circuit 706 for controlling, based on the selection code, the digital sampling circuit 704 operating in the fixed clock domain. Various implementations of the control circuit 706 and digital sampling circuit 704 are illustrated by FIGS. 8-11.

Exemplary Digital Circuit Implementations

Figure 8:
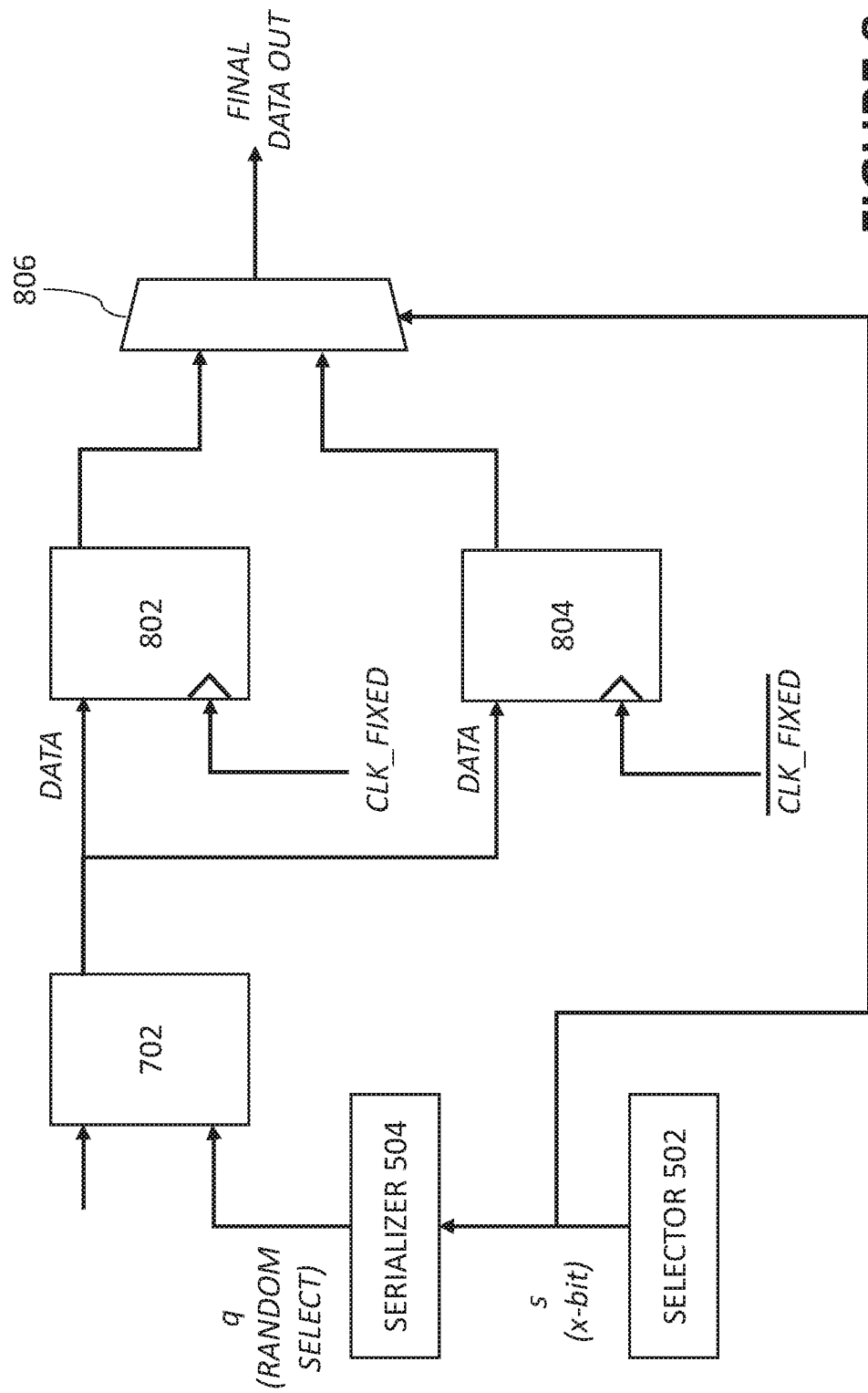
FIGS. 8-11 illustrate exemplary digital circuits implementing a scheme for avoiding the high speed data handoff, according to some embodiments of the disclosure.

One exemplary implementation to avoid the high speed data hand off is to sample the output data onto two parallel flip flops, one on the rising edge of fixed clock and one on the falling edge of the fixed clock. The outputs from the two parallel flip flops can be selected based on the selection code (i.e., the "pre-knowledge" of the random track-select signal) to generate a final output. FIG. 8 shows a digital circuit that implements such a scheme. The scheme involves sampling the received data "DATA" at various sampling time instants, e.g., using parallel flip flops 802 and 804 clocked by CLK_FIXED, and $\overline{\text{CLK\_FIXED}}$ respectively. $\overline{\text{CLK\_FIXED}}$ can be generated using an inverter based on CLK_FIXED. The various sampling time instants used by the flip flops 802 and 804 have different timings with respect to the randomized time instant. In this example, flip flop 802 samples earlier, on the rising edge of the fixed clock CLK_FIXED, and flip flop 804 samples later, on the falling edge of the fixed clock CLK_FIXED, or equivalently, on the rising edge of the and $\overline{\text{CLK\_FIXED}}$. Controlling the sampling circuitry based on the selection code comprises selecting, based on the selection code, output data produced by sampling the received data at a particular one of the various sampling time instants. To make the selection, a multiplexer 806 can mux the two flip flop outputs using the selection code to generate the final data output "FINAL DATA OUT". Effectively, one of the flip flops is selected based on the "pre-knowledge" of the random track-select signal. The selected one preferably samples the data after the data has been stable for a fixed period of time (setup time), and/or that the data is stable for a fixed period of time after the selected one samples (hold time). In any given window of time, one of the two parallel flip flops 802 and 804 may have "bad" data due to setup or hold failures, but the other one would have stable data (i.e., where setup time is relaxed). The particular one of the various sampling time instants used by the selected flip flop, when compared against the rest of the various sampling time instants used by the non-selected flop flop(s), ensures the received data is valid for a longer period of time prior to and/or after sampling. A control circuit, e.g., the multiplexer 806, can select an output which is sampled at a sampling instant that yields a longer setup or hold time with respect to the randomized time instant than one or more other sampling instants.

Figure 9:
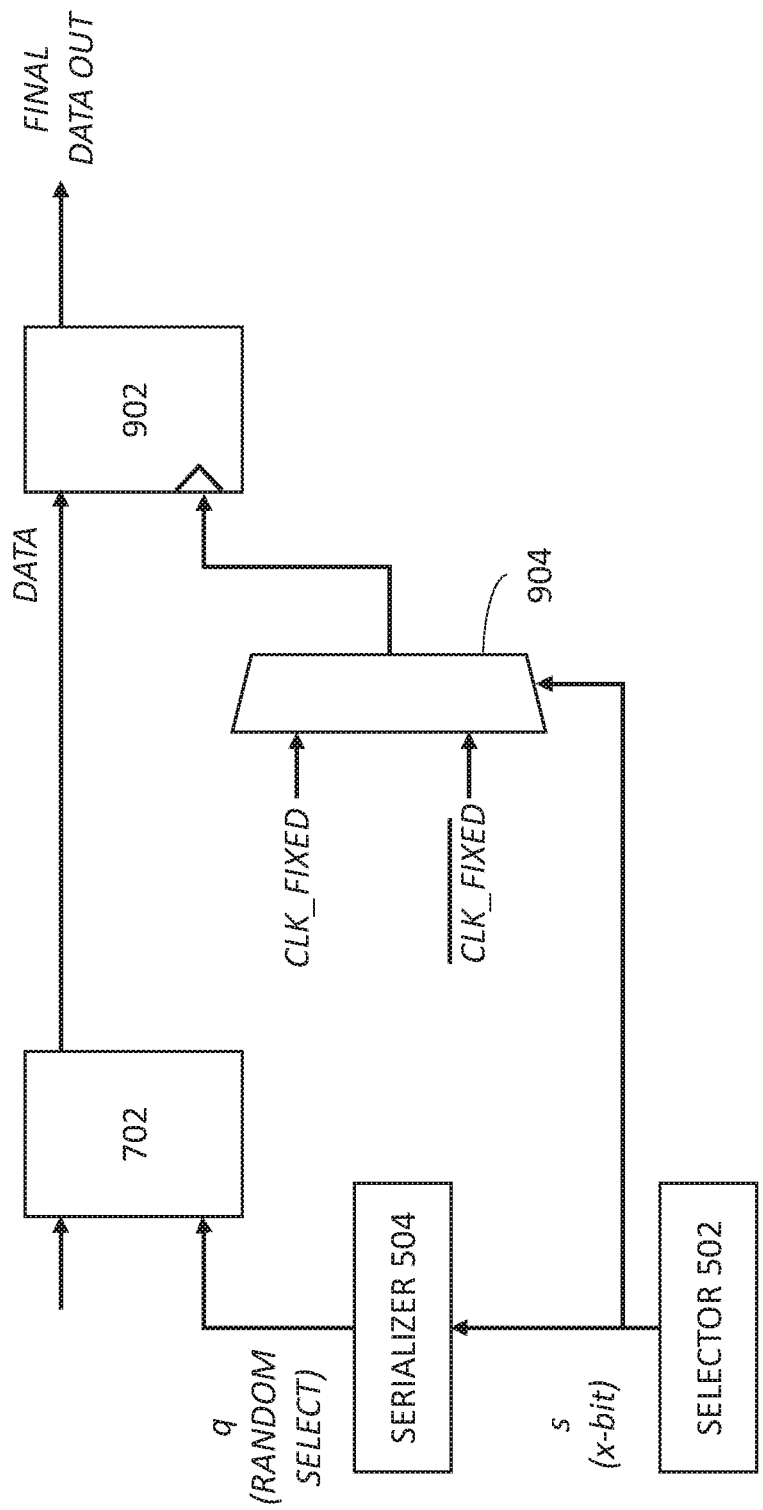

An alternative to the approach illustrated in FIG. 8 is to use one flip flop (only), but select one clock among a plurality of clocks to use (e.g., selecting one clock to sample on either the rising edge of fixed clock or one on the falling edge of the fixed clock). The clock is selected to ensure that the sampling instant occurs after the data has been stabled for a period of time or that the data would be stable for a period of time after the sampling instant. FIG. 9 shows a digital circuit that implements such a scheme. Controlling the sampling circuitry based on the selection code comprises selecting, based on the selection code, a sampling instant from a plurality of available time instants to sample the received data. In this example, a single flip flop 902 is used, but multiple clock signals CLK_FIXED, and $\overline{\text{CLK\_FIXED}}$ are provided to implement possible sampling instants. $\overline{\text{CLK\_FIXED}}$ can be generated using an inverter based on CLK_FIXED. The possible sampling time instants have different timing with respect to the randomized time instant. In this example, using $\overline{\text{CLK\_FIXED}}$ can mean that flip flop 902 would sample earlier, on the rising edge of the fixed clock CLK_FIXED, and using $\overline{\text{CLK\_FIXED}}$ can mean that flip flop 902 would sample later, on the falling edge of the fixed clock CLK_FIXED, or equivalently, on the rising edge of the and $\overline{\text{CLK\_FIXED}}$. A control circuit, e.g., the multiplexer 904, can select a sampling instant, i.e., one of the clock signals, to sample the data signal. In this example, the multiplexer 904 controlled by the selection code s can select CLK_FIXED or $\overline{\text{CLK\_FIXED}}$ to be used by the single flip flop 902. The selected sampling instant yields a longer setup or hold time with respect to the randomized time instant than one or more other sampling instants.

Figure 10:
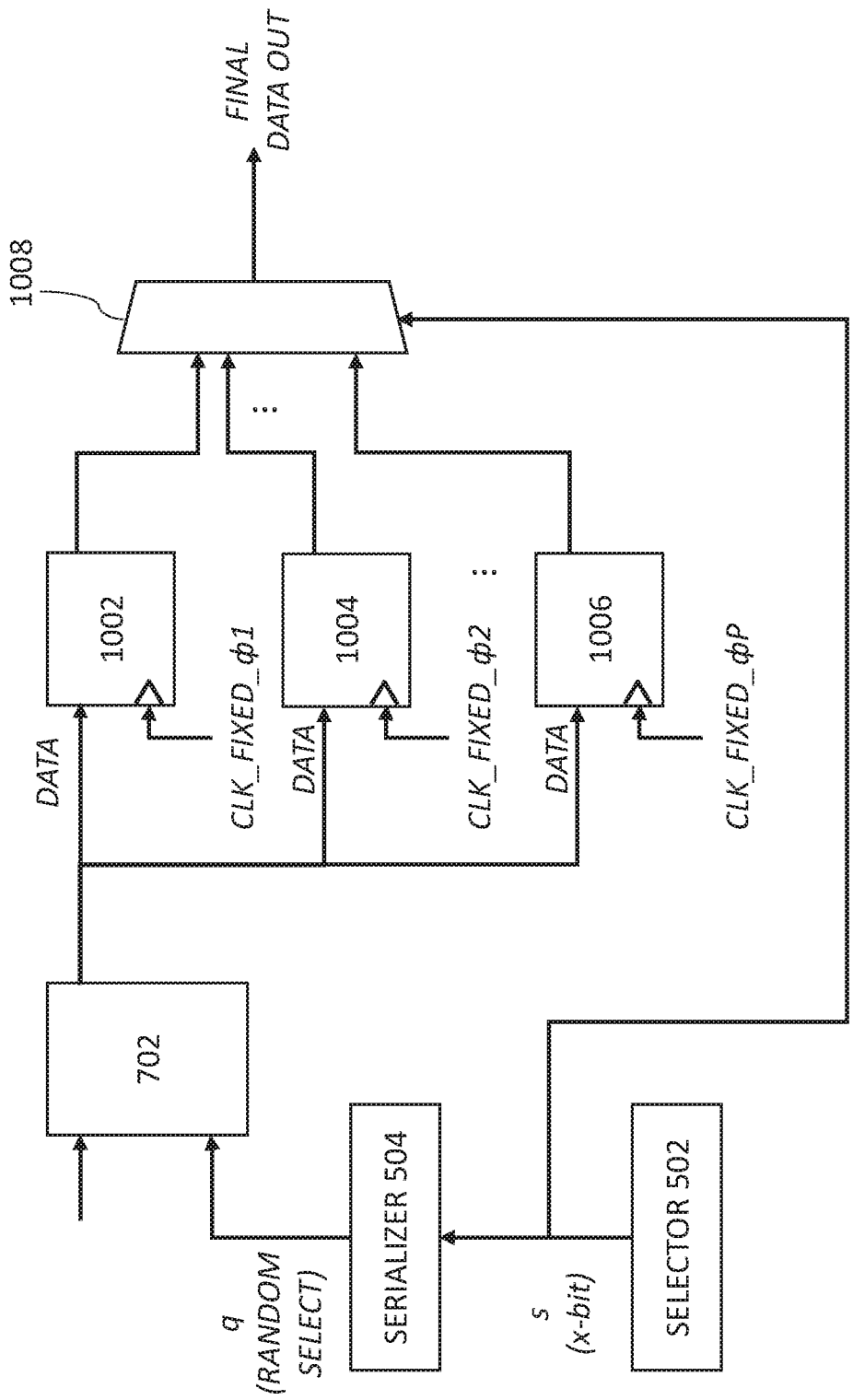
Figure 11:
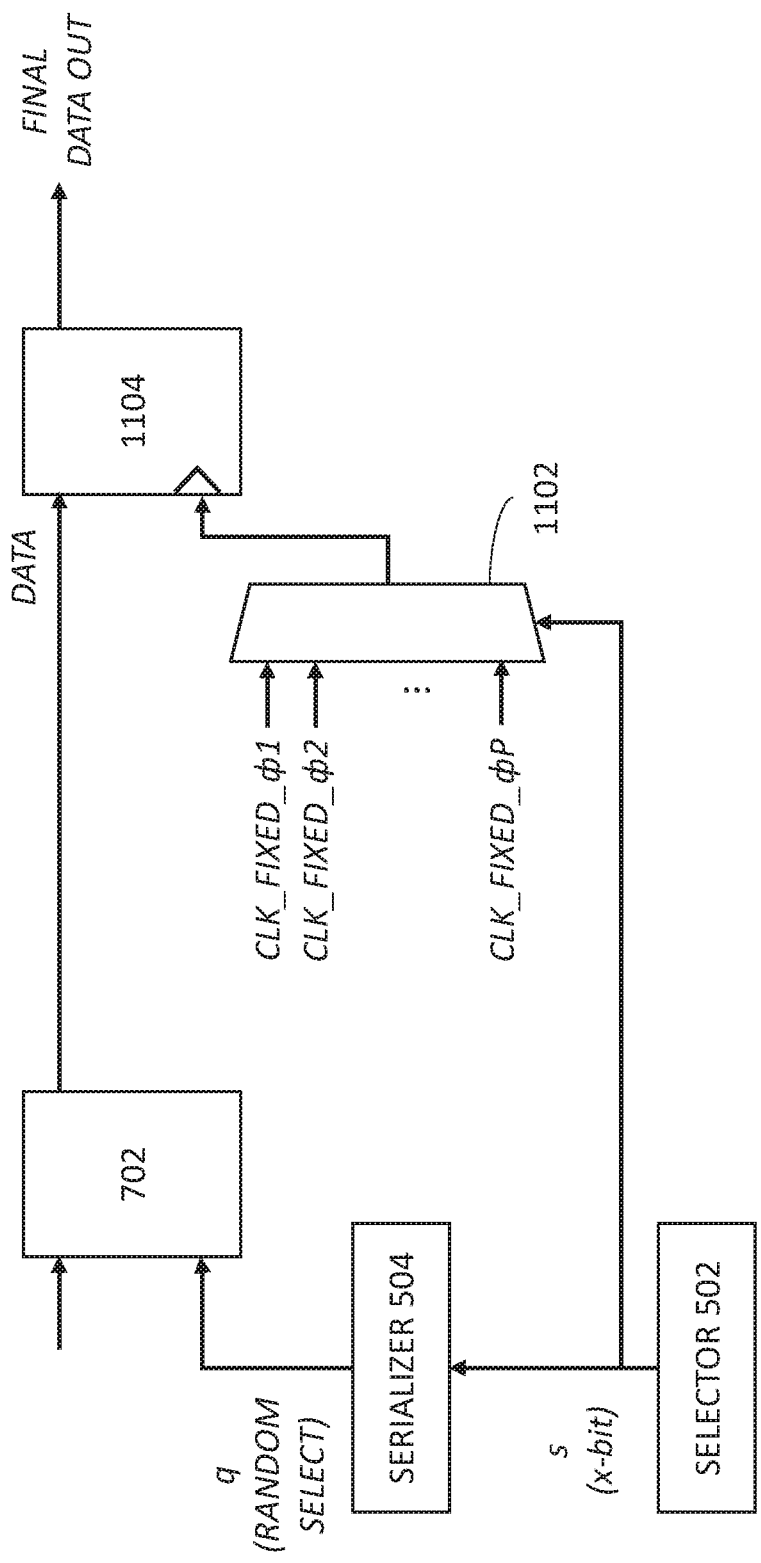

Both approaches illustrated by FIGS. 8 and 9 can be extended to more than two sampling instants to choose from, if needed. The exemplary approaches illustrated by FIGS. 8 and 9 can be extended to use three or more clock signals having different phases, as shown in FIGS. 10 AND 11. For FIGS. 8 and 9, two clock signals 180 degrees out of phase are used. In some other embodiments, it is possible to have P clock signals which have different phases, e.g., 360/P degrees out of phase with each other. The clock signals having different phases can implement different sampling instants so that a longer setup time or hold time with respect to the randomized time instant can be achieved. In FIG. 10, the system can include a plurality of sampling circuits, e.g., flip flops 1002, 1004, . . . 1006, sampling the data signal based on respective clock signals with different phases, e.g., CLK_FIXED_ϕ1, CLK_FIXED_ϕ2, . . . CLK_FIXED_ϕP. A selection circuit, e.g., a multiplexer 1008, can selecting one output from the sampling circuits as a final output of the digital sampling circuit based on the selection code. In FIG. 11, the system can have clock signals having different phases, e.g., CLK_FIXED_ϕ1, CLK_FIXED_ϕ2, . . . CLK_FIXED_ϕP. The selection circuit, e.g., multiplexer 1102, selects one of clock signals for sampling the data signal based on the selection code. A single flop 1104 can sample the data based on the selected clock signal.

Illustrative System Having a Randomized to Fixed Clock Domain Crossing

A system can have a randomized to fixed clock domain crossing or interface, where data is generated using a random clock, and the data is latched circuitry operating with a fixed clock. The system can include a data generating element (similar to circuitry 202 of FIG. 2, or circuitry 702 of FIGS. 7-11) having an output, i.e., "DATA", which becomes valid at a randomized time instant determined by a selection code s. The system can be a time-interleaved analog-to-digital converter, and the data generating element can be an analog-to-digital converter selected at random from a plurality of available analog-to-digital converters. In some cases, the data generating element can be a reference analog-to-digital converter sampling an analog input for calibration purposes. The system further includes a sampling circuit (e.g., circuitry 204 of FIG. 2, or digital sampling circuit 704 of FIGS. 7-11) receiving the output, i.e., "DATA", operates with a plurality of clock signals with different phases, e.g., P fixed clock signals being 360/P degrees out of phase with each other. Sampling circuit can be any suitable digital circuit for capturing/storing/latching output data from the data generating element. The system further includes a control circuit (e.g., control circuit 706 of FIG. 7) that can direct the sampling circuit based on the selection code to avoid the high speed data handoff. The selection code indicates relative timing of the randomized time instant with respect to one of the clock signals in the sampling circuit. In some embodiments, the sampling circuit comprises a plurality of storage elements (e.g., flip flops) triggered by a respective clock signal for storing the output. The respective clock signals can have different phases. The control circuit selects an output from one of the storage elements based on the selection code. This scheme is illustrated by FIGS. 8 and 10. In some embodiments, the control circuit selects one of the clock signals having different phases based on the selection code. The sampling circuit can have a (single) storage element triggered by the selected clock signal for storing the output. This scheme is illustrated by FIGS. 9 and 11.

Using only a Part of the Selection Code in the Control Circuit

As previously explained, the selection code has information regarding when the random sample, i.e., the data, becomes valid with respect to a fixed clock in the fixed clock domain. With an appropriate selection code, the control circuit can control or direct the digital sampling circuit based on only one or more significant bits (MSBs) of the selection code, e.g., disregarding the less significant bits (LSB). For instance, the MSB(s) provides sufficient information to indicate whether the randomized time instant falls within a first half or portion of the clock period of the fixed clock or within a second/later half or portion of the clock period of the fixed clock. Accordingly, the MSB(s) can allow a decision to be made on the sampling instant that the sampling circuit should use for sampling the data, without having to use the LSB(s). For example, suppose three bits are used as the selection code to indicate that the randomized time instant falls within a particular one out of eight time slots within the period of the fixed clock. The MSB being 1 or 0 can indicate whether the randomized time instant falls within the category of randomized time instants 402 of FIG. 4A versus the category of randomized time instants 404 of FIG. 4B. Therefore, the MSB can be used to control the sampling circuit, e.g., control the multiplexers/muxes seen in FIGS. 8-11.

Variations and Implementations

The examples described herein are merely illustrative examples of how the digital circuits can be implemented to avoid high speed data handoff. It is envisioned by the disclosure that other digital circuits can be implemented to take the "pre-knowledge" of the timing of the randomized time instant relative to the fixed clock and use that "pre-knowledge" to adjust the sampling of the data available at that randomized time instant.

The present disclosure encompasses apparatuses which can perform the various methods described herein, including methods illustrated by FIG. 6. Such apparatuses can include parts shown in FIGS. 5, 7-11. Parts of various apparatuses for avoiding the high speed data hand off can include electronic circuitry to perform the functions described herein. In some cases, one or more parts of the apparatus can be provided by a processor specially configured for carrying out the functions described herein. For instance, the processor may include one or more application specific components, or may include programmable logic gates which are configured to carry out the functions describe herein. The circuitry can operate in analog domain, digital domain, or in a mixed signal domain. In some instances, the processor may be configured to carrying out the functions described herein by executing one or more instructions stored on a non-transitory computer medium.

Note that the activities discussed above with reference to the FIGURES are applicable to any integrated circuits that involve processing analog signals and converting the analog signals into digital data using a plurality of ADCs operating in a time-interleaved fashion. In certain contexts, the features discussed herein related to a high-speed ADC, i.e., the time-interleaved ADC, can be applicable to medical systems, scientific instrumentation, wireless and wired communications systems (especially systems requiring a high sampling rate), radar, industrial process control, audio and video equipment, instrumentation, and other systems which uses ADCs. The level of performance offered by time-interleaved ADCs can be particularly beneficial to products and systems in demanding markets such as high speed communications, medical imaging, synthetic aperture radar, digital beamforming communication systems, broadband communication systems, high performance imaging, and advanced test/measurement systems (oscilloscopes).

In the discussions of the embodiments above, the parts and components can readily be replaced, substituted, or otherwise modified in order to accommodate particular circuitry needs. Moreover, it should be noted that the use of complementary electronic devices, hardware, software, etc.

offer an equally viable option for implementing the teachings of the present disclosure.

In one example embodiment, any number of components of the FIGURES may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In another example embodiment, the components of the FIGURES may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on chip (SOC) package, either in part, or in whole. An SOC represents an IC that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the error calibration functionalities may be implemented in one or more silicon cores in Application Specific Integrated Circuits (ASICs), Field Programmable Gate Arrays (FPGAs), and other semiconductor chips.

It is also imperative to note that all of the specifications, dimensions, and relationships outlined herein (e.g., the number of processors, logic operations, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than in a restrictive sense.

Note that with the numerous examples provided herein, interaction may be described in terms of two, three, four, or more electrical components or parts. However, this has been done for purposes of clarity and example only. It should be appreciated that the system can be consolidated in any suitable manner. Along similar design alternatives, any of the illustrated components, modules, blocks, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments. It is also important to note that the functions configuring a time-interleaved ADC, illustrate only some of the possible functions that may be executed by, or within, systems illustrated in the FIGURES. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure. Numerous other changes, substitutions, variations, alterations, and modifications may be ascertained to one skilled in the art and it is intended that the present disclosure encompass all such changes, substitutions, variations, alterations, and modifications as falling within the scope of the appended claims. Note that all optional features of the apparatus described above may also be implemented with respect to the method or process described herein and specifics in the examples may be used anywhere in one or more embodiments.

What is claimed is:

1. A method for avoiding high speed data handoff, the method comprising:
   receiving, by sampling circuitry, data which becomes valid at a randomized time instant determined by a selection code identifying a particular time slot randomly selected among a plurality of time slots within a period in a fixed clock domain; and
   controlling the sampling circuitry operating in the fixed clock domain based on the selection code to ensure setup or hold time of the sampling circuitry is longer than a clock period of a random clock used to trigger generation of the data.

2. The method of claim 1, wherein the selection code dictates the randomized time instant when the data becomes valid.

3. The method of claim 1, further comprising:
sampling the received data at various sampling time instants having different timing with respect to the randomized time instant.

4. The method of claim 3, wherein controlling the sampling circuitry based on the selection code comprises selecting, based on the selection code, output data produced by sampling the received data at a particular one of the various sampling time instants.

5. The method of claim 4, wherein the particular one of the various sampling time instants, when compared against the rest of the various sampling time instants, ensures the received data is valid for a longer period of time prior to or after sampling.

6. The method of claim 1, wherein controlling the sampling circuitry based on the selection code comprises selecting, based on the selection code, a sampling instant from a plurality of available time instants to sample the received data.

7. The method of claim 1, further comprising:
selecting, by the selection code, an analog-to-digital converter among a plurality of analog-to-digital converters at random to sample an analog input and generate the data.

8. Digital sampling circuit, the digital sampling circuit comprising:
a data input receiving a data signal from a randomized clock domain;
a control input receiving a selection code which dictates a randomized time instant when the data signal becomes valid and identifies a particular time slot randomly selected among a plurality of time slots within a period in a fixed clock domain; and
a control circuit for controlling, based on the selection code, the digital sampling circuit operating in a fixed clock domain.

9. The digital sampling circuit of claim 8, wherein the control circuit controls the digital sampling circuit based on only one or more most significant bits of the selection code.

10. The digital sampling circuit of claim 8, wherein the selection code indicates relative timing of the randomized time instant with respect to a clock signal of the digital sampling circuit.

11. The digital sampling circuit of claim 8, wherein the control circuit selects an output which is sampled at a sampling instant that yields a longer setup or hold time with respect to the randomized time instant than one or more other sampling instants.

12. The digital sampling circuit of claim 8, further comprising:
a plurality of sampling circuits sampling the data signal based on respective clock signals with different phases.

13. The digital sampling circuit of claim 12, wherein the control circuit comprises a multiplexer for selecting one output from the plurality of sampling circuits as a final output of the digital sampling circuit.

14. The digital sampling circuit of claim 8, wherein the control circuit selects a sampling instant to sample the data signal, and the selected sampling instant yields a longer setup or hold time with respect to the randomized time instant than one or more other sampling instants.

15. The digital sampling circuit of claim 8, further comprising:
clock signals having different phases;
wherein the control circuit comprises a multiplexer which selects one of clock signals for sampling the data signal.

16. A system with extended setup or hold time in a randomized to fixed clock domain crossing, the system comprising:
a data generating element having an output which becomes valid at a randomized time instant determined by a selection code;
a sampling circuit receiving the output operates with a plurality of clock signals providing different sampling instants; and
a control circuit for directing the sampling circuit to use one of sampling instants determined based on the selection code.

17. The system of claim 16, wherein the system is a time-interleaved analog-to-digital converter, and the data generating element is an analog-to-digital converter selected at random from a plurality of available analog-to-digital converters.

18. The system of claim 16, wherein the selection code indicates relative timing of the randomized time instant with respect to one of the clock signals in the sampling circuit.

19. The system of claim 16, wherein:
the sampling circuit comprises a plurality of storage elements triggered by a respective one of the plurality of clock signals providing the different sampling instants for storing the output; and
the control circuit selects an output from one of the storage elements based on the selection code.

20. The system of claim 16, wherein:
the control circuit selects one of the plurality of clock signals providing the different sampling instants based on the selection code; and
the sampling circuit comprises a storage element triggered by the selected clock signal for storing the output.

* * * * *